(12) United States Patent
Hashimoto

(10) Patent No.: US 6,420,701 B1
(45) Date of Patent: Jul. 16, 2002

(54) METHOD OF DETERMINING AVERAGE CRYSTALLITE SIZE OF MATERIAL AND APPARATUS AND METHOD FOR PREPARING THIN FILM OF THE MATERIAL

(75) Inventor: Hiroyuki Hashimoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/119,660

(22) Filed: Jul. 21, 1998

(30) Foreign Application Priority Data

Jul. 23, 1997 (JP) ............................................. 9-197254
Jul. 23, 1997 (JP) ............................................. 9-197255

(51) Int. Cl.$^7$ ............................................... H01J 37/29
(52) U.S. Cl. ....................................... 250/305; 250/307
(58) Field of Search ................................. 250/305, 306, 250/307, 310

(56) References Cited

U.S. PATENT DOCUMENTS

| | | | | |
|---|---|---|---|---|
| 4,952,804 A | * | 8/1990 | Nakagawa et al. | 250/307 |
| 4,978,855 A | * | 12/1990 | Liebl et al. | 250/305 |
| 5,093,573 A | * | 3/1992 | Mikoshiba et al. | 250/310 |
| 5,148,025 A | * | 9/1992 | Ahn et al. | 250/305 |
| 5,488,625 A | | 1/1996 | Nakamori et al. | 372/50 |
| 5,955,153 A | * | 9/1999 | Sunderland | 427/535 |

FOREIGN PATENT DOCUMENTS

| JP | 5-17115 | 1/1993 |
|---|---|---|
| JP | 5-43213 | 2/1993 |
| JP | 5-78194 | 3/1993 |
| JP | 6-102531 | 4/1994 |
| JP | 6-220638 | 8/1994 |
| JP | 7-206416 | 8/1995 |

OTHER PUBLICATIONS

R.E. Franklin, "Crystallite Growth in Graphitizing and Non–graphitizing carbons", Proc. Roy. Soc., A209, pp. 196–218.
F. Tuinstra, et al., "Raman Spectrum of Graphite," J. Chem. Phys. 53, 1970, pp. 1126–1130.
L.B. Leder, et al. "Characteristics Energy Losses of Electrons in Carbon," J. Appl. Phys., vol. 31, pp. 1422–1426.

* cited by examiner

Primary Examiner—Kiet T. Nguyen
(74) Attorney, Agent, or Firm—Fitzpatrick, Cella, Harper & Scinto (57) ABSTRACT

A specimen of thin film of a material having a crystal structure and exhibiting an absorption in ultraviolet region is irradiated with electron beams and the energy loss spectrum of the reflected electrons is observed and utilized. For example, the correlations of (1) the energy of the plasmon peak and the relative intensity of the plasmon peak to the elastic peak or the profile thereof, (2) the energy (loss energy being between 4 and 8 eV) of the peak attributed to $\pi \rightarrow \pi^*$ transition and the relative intensity of the $\pi \rightarrow \pi^*$ peak to the elastic peak or the profile thereof and (3) the profile of the background of the continuous spectrum formed by inelastic scattering of electrons or the relative intensity of a point to the elastic peak and the average crystallite size of the material of the specimen are used to determine the crystallite size of the material.

13 Claims, 6 Drawing Sheets

METHOD OF DETERMINING AVERAGE CRYSTALLITE SIZE OF MATERIAL AND APPARATUS AND METHOD FOR PREPARING THIN FILM OF THE MATERIAL

BACKGROUND OF THE INVENTION

1. Field of the Invention

This invention relates to an apparatus and a method for preparing a thin film containing a material having a crystal structure and exhibiting an absorption in ultraviolet region, in particular a carbon thin film containing graphite as principal ingredient. More particularly, it relates to an apparatus for preparing carbon thin film that is provided with means for analyzing the state of carbon thin film incorporated into a micro-area of 1 $\mu$m and less square and a method of preparing a carbon thin film comprised of feeding back the result of the analysis of the state of carbon and reflecting it to the carbon thin film preparing conditions.

2. Related Background Art

Graphite is an allotrope of carbon, having structure consisting of hexagonal reticular planes with the sp$^2$ hybridized orbital and showing the following specific physical properties. While it shows a semimetallic electroconductivity, a thermal conductivity three times as high as that of copper, a very high elasticity and also a very high mechanical strength within the reticular planes of carbon, its electric and thermal conductivities fall remarkably across the layers of its multilayer structure. Thus, it is exceptionally anisotropic if viewed along the reticular planes and a direction perpendicular to the planes.

A variety of different models have been proposed for the layered structure of reticular planes of carbon. For example, Franklin defines a turbostratic structure where reticular planes are randomly laid one on the other and a graphite crystal structure where reticular planes are arranged in a coordinated manner and says that each distance separating the reticular planes is 0.344 nm for the turbostratic structure and 0.335 nm for the graphite crystal (R. E. Franklin, Proc. Roy. Soc., A209, 196(1951)).

Because of the remarkable physical properties of graphite due to its particular structural feature including a high thermal resistance and a high chemical resistance, it finds a wide variety of industrial applications including refractory materials, materials of atomic furnaces and heat-emitting bodies. Additionally, highly-crystallized graphite shows excellent spectral and reflective characteristics for X-rays and neutron rays and hence are advantageously used for monochromators and filters.

Recently, a graphite intercalation compound obtained by utilizing interlayer spaces of graphite has been attracting attention and lithium ion cells prepared by utilizing a graphite intercalation compound are currently popular as small and high-performance secondary cells that find various practical applications. Other applications of the graphite include materials to be used for electronic circuits such as resistor coating film, adsorptive materials utilizing the porous structure of the graphite and electron emitting materials. Particularly, materials listed above and produced in recent years are of high quality, finely processed and thin. In response, there is a demand for techniques that can effectively analyze the structure, more specifically the average crystallite size, of the graphite used in a very fine area on the surface of a product comprising such a material.

The structure of graphite is typically defined in terms of the size of crystallites (crystallite size), using either the crystallite size Lc as observed along a direction perpendicular to the hexagonal reticular plane or the crystallite size La as observed along a direction parallel to the hexagonal reticular plane.

For the purpose of the present invention, the term "crystallite" refers to a unitary crystal (microcrystal) that is a constituting member of polycrystal or a unitary crystal (microcrystal) that is observed in a noncrystalline substance. As far as this specification is concerned, the crystallite size of graphite refers to Lc as observed along a direction perpendicular to the hexagonal reticular plane.

It is known that graphite materials having different average crystallite sizes show physical properties that are remarkably different from each other, including the specific resistance, the thermal conductivity and the bending strength. For example, the specific resistance, the thermal conductivity and the bending strength will be respectively about $50 \times 10^{-4}$ $\Omega$cm, about 3 kcal/mhr° C. and about 900 kgf/cm$^2$ for glassy carbon with an Lc of 10 nm, about $40 \times 10^{-4}$ $\Omega$cm, about 7 kcal/mhr° C. and about 1100 kgf/cm$^2$ for glassy carbon with an Lc of 20 nm and about $10 \times 10^{-4}$ $\Omega$cm, about 120 kcal/mhr° C. and about 200 kgf/cm$^2$ for artificial graphite. Clearly, graphite materials having different average crystallite sizes show physical properties that are remarkably different from each other. Therefore, in analyzing physical properties of a graphite material, it is indispensable to know the average crystallite size of the material. Conventionally, graphite, thin film containing graphite in particular, is produced by means of a thermal CVD, where a gaseous hydrocarbon compound is introduced onto a hot substrate to thermally decompose the gaseous compound and causes carbon in the decomposition product to precipitate in a vapor phase or a plasma CVD, where plasma is introduced into a reaction space to activate and decompose a gaseous hydrocarbon compound and causes carbon in the decomposition product to precipitate at relatively low temperature. Alternatively, graphite may be produced by heat treating a filmy polymeric compound. Known specific techniques for producing graphite include the one (as disclosed in Japanese Patent Publication No. 6-102531) with which a hydrocarbon compound such as methane is thermally decomposed by means of hot plasma to produce scale like film having a turbostratic crystal structure (the average crystallite size (Lc) is between that of graphite single crystal and that of amorphous carbon), the one (as disclosed in Japanese Patent Application Laid-Open No. 6-220638) with which a carbon coat is formed at relatively low temperature between 350 and 450° C. by applying the catalytic function of nickel oxide to a hot CVD (so that nickel oxide may be carried on the surface of a substrate) and the one (as disclosed in Japanese Patent Application Laid-Open No. 5-17115) with which graphite film is prepared by laying a number of polymeric films that have been subjected to a preliminary oxidation treatment process into a multilayer structure, which is then pressed and heat-treated. Otherwise, there are also known techniques including the one (as disclosed in Japanese Patent Application Laid-Open No. 5-43213) with which a film of a polyimide compound having a fluorene molecular structure is pinched between a pair of graphite plates and baked to produce graphite and the one (as disclosed in Japanese Patent Application Laid-Open No. 5-78194) with which molten carbon on a metal column is made to precipitate on crystal seeds of graphite. There is also known a method of producing ultra-fine particles of graphite by vaporizing carbon through arc-discharge and subsequently cooling and solidifying the vaporized carbon (Japanese Patent Application Laid-Open No. 7-206416).

Known techniques for analyzing various graphite materials for determining the structure (crystal structure) include X-ray diffraction method, Raman spectroscopy, transmission electron microscopy, X-ray photoelectron spectroscopy, ultraviolet photoelectron spectroscopy, high resolution electron energy loss spectroscopy, transmission-type electron energy loss spectroscopy and low energy electron diffraction method (see, for example, S. Aizawa, "Hyoumen Kagaku (Surface Science)", Vol. 11, No. 7, 398 (1990)).

X-ray diffraction method is a technique for determining the structure of a graphite material, using a diffraction pattern obtained by irradiating the specimen with X-rays and a computation model. With this technique, the distance between hexagonal reticular planes of the specimen is estimated on the basis of the diffraction peak, and the average crystallite size Lc as determined along a direction perpendicular to the hexagonal reticular planes of the specimen is estimated on the basis of the full width at half maximum B of the diffraction peak. The full width at half maximum B and the average crystallite size Lc show a relationship as defined by the formula below;

$$Lc \cdot B \cdot \cos\theta = 0.9\lambda$$

where $\theta$ is the Bragg angle and $\lambda$ is the wavelength of X-rays.

Raman spectroscopy is typically used for determining the structure of a graphite material on the basis of the spectrum of Raman scattering light from the specimen, using an ordinary laser as source of excitation. The average crystallite size La is estimated in a direction parallel to the hexagonal reticular planes from the center wave number and the full width at half maximum of the peak (1580 cm$^{-1}$, $E_{2g}$ mode) attributed to the graphite structure, those of the peak (at or around 1360 cm$^{-1}$, edge mode) reflecting the structural disorder of the specimen and their intensity ratio (see, for example, F. Tuinstra and J. L. Koenig, J. Chem. Phys., 53, 1126 (1970)).

With the analyzing technique using a transmission electron microscope, a thinned specimen of crystalline or granular graphite as thin as 100 nm is directly observed through a transmission electron microscope for analysis (and photographed on a silver salt film).

X-ray photoelectron spectroscopy is a technique of irradiating the specimen in ultra-vacuum with soft X-rays to analyze the kinetic energy of photoelectrons emitted from the surface of the specimen. This technique provides information on the chemical bond of carbon atoms to be obtained from the photoelectron peak energy, the X-ray excited Auger electron peak energy, and its profile, the existence or inexsistance of an energy loss peak, etc. The obtained information may include the existence or inexistence of Sp$^2$ carbon from the energy-loss (inelastic) peak assigned to $\pi \to \pi^*$ transitions and plasma, and the chemical state of Sp$^2$ carbon, if it exists.

Ultraviolet photoelectron spectroscopy provides information mainly on phonons including the dispersion relations of graphite n-bands, in which the kinetic energy of photoelectrons, emitted from the surface of the specimen when irradiating the specimen with ultraviolet rays (approximately 10 eV) in ultra-vacuum, are analyzed.

High resolution electron energy loss spectroscopy is a technique for analyzing the energy of inelastic electrons when irradiating the specimen with monochromatic electron beams (approximately 10 eV). Basically, this technique provides information on phonons including the dispersion relations of graphite as the above described ultraviolet photoelectron spectroscopy.

Transmission-type electron energy loss spectroscopy is typically used for analyzing the state of a local area of a solid thin film specimen by observing the energy loss of electrons passing through the specimen by means of a transmission electron microscope. It has been reported by means of this technique that both the energy loss attributed to $\pi \to \pi^*$ transitions and the energy loss attributed to plasmon observed in graphite vary remarkably depending on the crystallinity of graphite (L. B. Leder and J. A. Suddeth, J. Appl. Phys., 31, 1422 (1960)). More specifically, both the energy loss attributed to $\pi \to \pi^*$ transitions and the energy loss attributed to plasmon increase with an increase of the crystallinity of graphite. It is also proved by computation in the above report that the above energy shifts are caused by differences in the density.

High resolution electron diffraction method is used to obtain information on the locational arrangement of atoms on the surface of a solid specimen by irradiating the specimen with electron beams having a wavelength substantially equal to the distance(s) separating atoms in the solid specimen (typically 100 eV or more) and observing the direction and the intensity of elastic electrons. If the specimen is graphite, the lattice constant and other characteristic parameters of the specimen can be estimated from ring-shaped pattern.

However, it is a known problem that graphite cannot be successfully formed in a micro-area of 1 $\mu$m and less square in the process of producing a graphite thin film or a thin film containing graphite as an ingredient and incorporating it into an electronic device as part thereof, while controlling the structure of the graphite particularly in terms of crystallite size. Additionally, if a graphite thin film is successfully formed in a micro-area of 1 $\mu$m and less square, the techniques that can be used for analyzing the crystallite size of the graphite are accompanied by the following problems.

Firstly, X-ray diffraction method, X-ray photoelectron spectroscopy and ultraviolet photoelectron spectroscopy adapted to utilize X-rays or ultraviolet rays that can hardly be converged cannot be used to analyze a micro-area of 1 $\mu$m and less square. It is also difficult with the state of the art to converge a laser beam that is typically used for Raman spectroscopy to not more than 1 $\mu$m. Thus, only electrons and ions are available for input radiation (probe) for analyzing the micro-area of 1 $\mu$m and less square because they can be focused with ease.

Additionally, Raman spectroscopy that uses photons (normally of visible light) for detection signals is accompanied by a problem that it cannot be used to selectively analyze a surface layer with a depth of not more than 10 nm.

Now, the remaining known techniques that can be used for analyzing graphite formed in a micro-area will be briefly discussed for their shortcomings.

While the technique of transmission electron microscopy is adapted to analyze a micro-area in detail, it requires a long time for the preparation of a specimen (because the specimen should be as thin as about 10 nm). Therefore, if graphite to be observed contains crystallites with different sizes, a large number of particles will have to be observed to consume a long time.

Transmission-type electron energy loss spectroscopy is also accompanied by the problem of requiring a long time for the preparation of a specimen.

While the technique of high resolution electron energy loss spectroscopy is adapted to scrutinize the phonon dispersion of graphite on the surface, it is accompanied by the problem that no information can be obtained on the sizes of graphite crystallites with the level of energy normally used for input radiation. Additionally, it requires a specific monochromator for reducing primary electron beams monochromatic to make the analyzer inevitably a very bulky one.

Low energy electron diffraction method is adapted to obtain the lattice constant of graphite on the surface of a micro-area but it cannot directly acquire information on the crystallite sizes of graphite. Additionally, if the specimen is a thin graphite film, it can be affected by the underlay (multiple diffraction) to produce a complex diffraction pattern that cannot be analyzed without difficulty.

Analyzing techniques using a transmission electron microscope require a pretreatment of the specimen. If a specifically designed analyzer is used, the specimen has to be exposed to the atmosphere at the risk of contamination.

Thus, with any known process of producing a graphite thin film of a thin film containing graphite as an ingredient and incorporating it into an electronic device as part thereof, it is difficult to form graphite in a micro-area of 1 µm and less square while controlling the structure of the graphite particularly in terms of crystallite size. It is also difficult to analyze the structure of the graphite thin film formed in a micro-area. Particularly, it is very difficult to determine the average particle size of the graphite formed in a micro-area of 1 µm and less square in a surface layer with a depth of not more than 10 nm because there is no known technique of analyzing the structure of a graphite thin film formed in such a micro-area and it is difficult to effectively control the conditions under which such a thin film is formed in such a micro-area.

SUMMARY OF THE INVENTION

Therefore, it is the object of the present invention to provide a method and an apparatus for forming a thin film of graphite or other carbon material having a crystal structure in a micro-area of 1 µm and less square under a controlled manner, while analyzing the structure of the thin film formed in the micro-area and determining the average particle size of the particles contained in the thin film.

According to an aspect of the present invention, there is provided a method of determining an average crystallite size of a material having a crystal structure and exhibiting an absorption in ultraviolet region, which comprises irradiating a specimen of the material with an electron beam and observing an energy loss spectrum of reflected electrons.

According to another aspect of the invention, there is provided an apparatus for preparing a thin film of a material having a crystal structure and exhibiting an absorption in ultraviolet region by means of a chemical vapor phase reaction, which comprises a container for preparing the thin film and a reflected electron energy loss spectroscopic analyzing system.

An apparatus for preparing a thin film of a material having a crystal structure according to the invention may also be characterized by comprising a system for controlling the conditions of preparing the thin film according to the signal from the reflected electron energy loss spectroscopic system.

According to still another aspect of the invention, there is provided a method of preparing a thin film of a material having a crystal structure and exhibiting an absorption in ultraviolet region by means of a chemical vapor phase reaction, which comprises analyzing a chemical state of the thin film by means of a reflected electron energy loss spectroscopic analyzing system without exposing it to the atmosphere, and improving a condition of preparing the thin film by feeding back an obtained result.

Preferably, in the analysis by means of reflected electron energy loss spectroscopy, the specimen is irradiated with electron beams and the energy loss spectrum of reflected electrons is observed to feed back the result of the analysis of the spectrum and reflect it to the conditions of preparing the thin film.

DETAILED DESCRIPTION OF THE PREFERRED EMBODIMENTS

With regard to a method of analyzing the structure of a thin film of a material having a crystal structure and a method of determining the average particle size of the structure according to the present invention, the expression of "irradiating the specimen with electron beams and observing and utilizing the spectrum of the energy loss of reflected electrons" refers to an operation of determining the crystallite sizes of the structure by utilizing the correlation of the average crystallite size of the material of the specimen, which can be determined by known means, with at least one of (1), (2) and (3) below:

(1) at least one of the energy value (loss energy being within a range between 20 and 30 eV) of the plasmon peak, the relative intensity of the plasmon peak to the elastic peak, which is the peak attributed to electrons reflected at the surface of the specimen without energy loss or loss energy 0 eV, and a profile of the background of the continuous spectra formed by inelastic electrons;

(2) at least one of the energy value (loss energy being within a range between 4 and 8 eV) of the peak attributed to $\pi \rightarrow \pi^*$ transitions, the relative intensity of the $\pi \rightarrow \pi^*$ peak to the elastic peak and a profile of the background of the continuous spectra formed by inelastic electrons; and (3) at least one of the profile of the background of the continuous spectrum formed by inelastic electrons and the relative intensity of a point (preferably with an energy level between ¼ and 9/10 of the elastic peak energy) to the elastic peak. Particularly, it is preferable for the purpose of the invention to use electron beams with an energy level between 200 eV and 3 keV in order to sensitively observe the peak attributed to $\pi \rightarrow \pi^*$ transition.

For the purpose of the invention, "ultraviolet rays" refer to electromagnetic waves having a wavelength of a range between 360 nm, which is the shortest wavelength of visible light, and 1 nm.

When electron beams are used to irradiate the specimen as input radiation (probe), it is easy to converge the beam to show a size not more than 1 μm and, as will be described hereinafter, it is possible to converge the beam to show a size of about 200 nm if a field emission electron gun is used with an acceleration voltage of 1 keV and an emission current of 1 nA. It is easy to locate the spot of analysis if this method is combined with an observation of the image of secondary electrons. Thus, it will be possible to scan a specific region with an electron beam.

It is known that the depth of analysis (sampling depth) depends on the kinetic energy of the electrons to be detected. While it is difficult to accurately know the depth of analysis, it can be estimated on the basis of the mean free path of electrons as will be briefly discussed below.

According to Tanuma et al., the mean free path of electron is between 0.6 and 1.0 nm when the electron energy is 200 eV, between 0.9 and 3.0 nm when the electron energy is 1 keV and between 1.8 and 5.0 nm when the electron energy is 2 keV (S. Tanuma, C. J. Pawell and D. R. Penn, Surf. Sci., 192, L849 (1987), although this report is not directly related to graphite specimens).

On the basis of the mean free path of electron (calculated value), the fact that 95% of the electrons escaping from the surface originate from a surface layer with a depth equal to three times of the mean free path of electron and that the depth of analysis may be smaller when analyzing reflected electrons, it can be assumed that the depth of analysis may practically be not more than 10 nm when electron beams with an energy level between 100 eV and 3 keV are used for the analysis.

For the purpose of the present invention, an electron beam refers to such an electron beam that is emitted from an electron gun with or without a deflector. The electron gun is preferably a field emission gun, where it does not require any specific monochromator for reducing primary electron beams monochromatic. While a thermionic emission gun may be used for the purpose of the invention, then the full width at half maximum (FWHM) $\Delta E$ for the primary electron beam energy is preferably not more than 0.4 eV.

A monochromator may be used in combination, if such a FWHM for the beam energy cannot be realized. Whichever type of the gun we select from the above, a gun capable of emitting a stable current is suitable. Any commercially available electron gun may be used for the purpose of the present invention. Such an electron gun typically comprises an electrostatic lens or an electromagnetic lens for focusing the emitted electrons.

The emission current of an electron gun is typically between 100 pA and tens of several nA. While the diameter of the electron beam emitted from the electron gun may vary significantly depending on the type of the electron gun and the acceleration voltage, it will be about 200 nm in the case of a field emission gun used with a typical acceleration voltage of 1 keV and an emission current of 1 nA.

The energy loss spectrum of the electrons reflected at the surface of the specimen is preferably observed by means of a deflection type energy analyzer that shows a high energy resolution. The energy analyzer may be a magnetic deflection analyzer, an electrostatic deflection analyzer or a Wien-filter type analyzer adapted to combine a magnetic field and an electric field, of which an electrostatic deflection analyzer may preferably be used because it is compact and economic. While electrostatic deflection analyzers include the concentric spherical type, the cylindrical mirror type, the cylindrical deflector type and so on, any of them may be used for the purpose of the invention. When a concentric spherical analyzer is used for the purpose of the invention, an electrostatic lens for focusing, accelerating or retarding the reflected electron beams may be provided on the input side of the analyzer.

A channeltron, a multi-channel plate or an electron multiplier for detecting the reflected electrons and an amplifier may additionally be used if necessary. The reflected electrons may be detected by means of a technique of using a lock-in amplifier or that of counting pulses after a pulse height analysis in a pulse count mode.

As described above, a method of observing the average crystallite size of a material having a crystal structure and showing an absorption effect in the ultraviolet region according to the invention can be realized at least by means of a combination of an electron gun and an electron energy analyzer and, because of its simplicity, it can be used in combination of one or more than vacuum containers that may be processing apparatus such as film forming apparatus.

For the purpose of the present invention, the specimen is made of a material having a crystal structure. Preferably, it is made of a material containing carbon as principal ingredient and, more preferably, it is made of graphite, although any materials that absorb lights in ultraviolet region (and therefore having a peak similar to the peak attributed to $\pi \rightarrow \pi^*$ transitions) and showing a crystal structure similar to that of graphite may be used for the purpose of the invention.

Thus, according to the invention, a thin film of a material having a crystal structure and showing an absorption effect in the ultraviolet region, preferably a carbon thin film containing graphite as principal ingredient, is formed by means of a thermal CVD, a plasma CVD or some other known system that utilizes a chemical vapor phase reaction and then, the obtained thin film is analyzed by means of reflected electron energy loss spectroscopy, irradiating it with electron beans in a manner as described above so that the result of the analysis may be fed back and reflected to the thin film preparing system to effective control the conditions of preparing the thin film. The system for controlling the conditions of preparing a thin film for the purpose of the invention may typically be adapted to utilize the source gas flow rate and the substrate temperature fed back to it by way of a control means.

For the purpose of the invention, the system to be used for reflected electron energy loss spectroscopy is preferably installed directly in the container for preparing a thin film so that the result of the analysis may be directly fed back and reflected to the conditions of preparing a thin film, although it may be contained in another container separated from the container for preparing a thin film. Additionally, the system to be used for reflected electron energy loss spectroscopy comprises at least an electron gun and an electron energy analyzer and the energy level of electrons emitted from the electron gun is found in a range between 200 eV and 3 keV.

For the purpose of the invention, a material having a crystal structure and showing an absorption in the ultraviolet region is preferably a carbon thin film containing graphite as principal ingredient. It is preferable that the graphite shows an average crystallite size between 2 nm and tens of several nm and that the carbon thin film has a thickness of not more than 100 nm and/or the area where the thin film is incorporated is 1 μm and less square. For the purpose of the invention, the expression of containing graphite as "principal ingredient" means that graphite is contained at least by 50% or more in the thin film to be formed, which may or may not be exclusively made of graphite. Elements that may additionally be contained in the thin film include nitrogen, oxygen, hydrogen, halogen elements such as fluorine, metals such as Pd and Pt, metal oxides such as PdO and $SnO_2$, carbides such as TiC and SiC and semiconductors such as Si and Ge.

Now, a method of determining the average crystallite size of graphite according to the invention will be described by way of examples.

Figure 1:
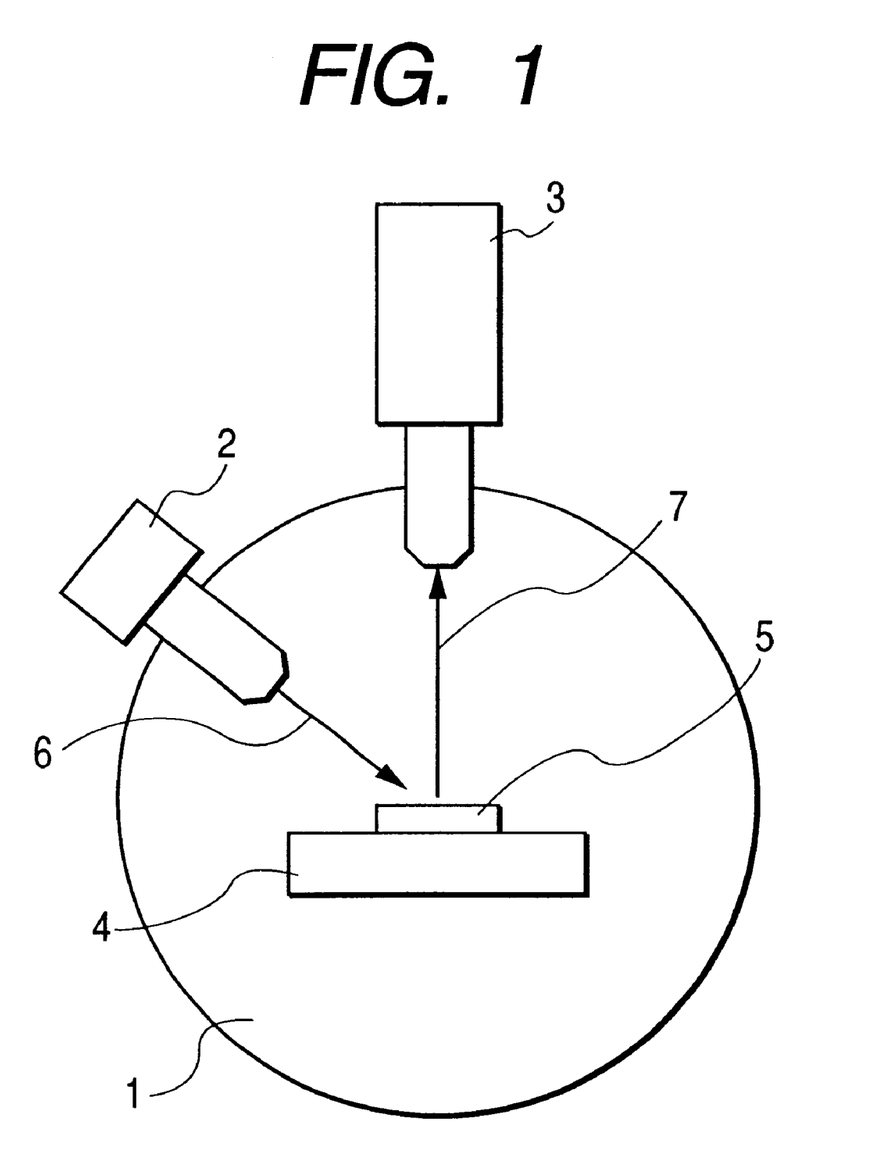
FIG. 1 is a schematic block diagram of a reflected electron energy loss spectrometer relating to the present invention.

Experiment 1:

FIG. 1 is a schematic block diagram of the system comprising a reflected electron energy loss spectrometer and used in this experiment. Referring to FIG. 1, there are shown a vacuum container 1, an electron gun 2, an electron energy analyzer 3 including a detector, a specimen stage 4, a specimen 5, a primary electron beam 6 and electrons 7 reflected at the surface of the specimen 5. This system was so arranged that the electron beam 6 emitted from the electron gun 2 is made to irradiate the specimen 5 within the vacuum container 1 and the reflected electrons 7 are detected by the analyzer 3 to analyze the specimen 5. A commercially available Auger electron spectrometer provided with a field emission type electron gun and a concentric spherical type electron energy analyzer was used in this experiment.

Specimens of graphite of four different types (with respective crystallite sizes of 1 nm, 2 nm, 8 nm and 20 nm with a margin of error of about ±0.2 nm) whose average crystallite sizes Lc had been determined in advance by X-ray deflection were used in this experiment. The average crystallite sizes of the four different types of graphite obtained independently by means of Raman spectroscopy were substantially equal to the respective values obtained by X-ray deflection method. Thus, the specimens of four different types of graphite showed substantially same average crystallite sizes both in a direction perpendicular to the hexagonal reticular plane (as determined by X-ray deflection) and in a direction parallel to the hexagonal reticular plane (as determined by Raman spectroscopy).

The observation was conducted under the following conditions:

primary electron acceleration energy: about 1 keV, electric current of primary electrons: about 2 nA.

operation mode of analyzer: constant retarding ratio mode (4 through 40) and internal pressure: not more than $5 \times 10^{-8}$ Pa.

The diameter of the primary electron beam was about 150 nm under the above conditions.

Figure 2:
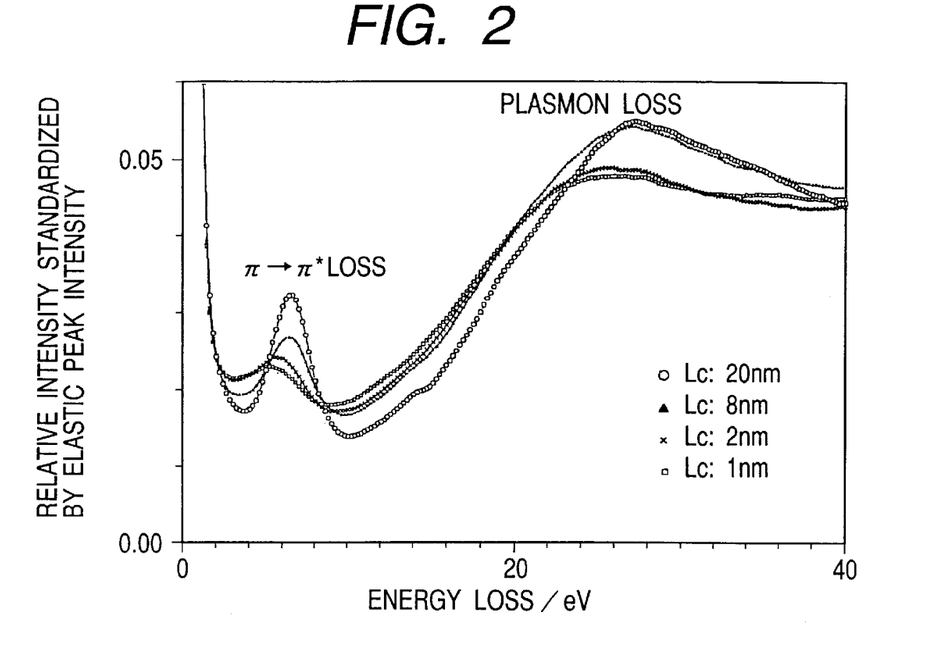
FIG. 2 is a graph showing the reflected electron energy loss spectra of graphite specimens with respective average crystallite sizes of 1, 2, 8 and 20 nm.

FIG. 2 is a graph showing the reflected electron energy loss spectra of graphite specimens observed under the above conditions (as standardized by the elastic peak intensity, where the electron energy loss is 0 eV).

Referring to FIG. 2, the energy loss peaks found in a range between 4 and 8 eV are attributed to carbon atoms having a double bond ($\pi \rightarrow \pi^*$), whereas the energy loss peaks found in a range between 20 and 30 eV are attributed to plasmon.

As seen or suggested from FIG. 2, as the crystallite size of graphite changes, (1) at least one characteristic of the energy value (loss energy being between 20 and 30 eV) of the plasmon peak, the relative intensity of the plasmon peak to the elastic peak and a profile of the background of the continuous spectra formed by inelastic electrons; and (2) at least one characteristic of the energy value (loss energy being between 4 and 8 eV) of the peak attributed to $\pi \rightarrow \pi^*$ transition, the relative intensity of the $\pi \rightarrow \pi^*$ peak to the elastic peak and a profile of the background of the continuous spectra formed by inelastic electrons;

that appear in the energy loss spectrum of the reflected electrons also changes.

Figure 3:
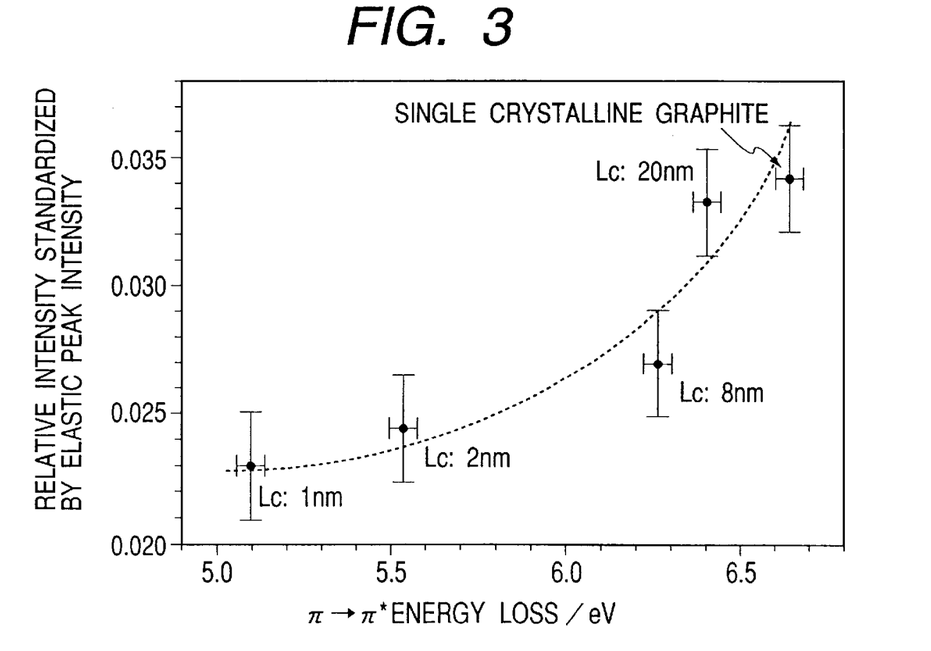
FIG. 3 is a graph showing the relationship between the graphite $\pi \rightarrow \pi^*$ loss energy and the relative peak intensity (as standardized by the elastic peak intensity).
Figure 4:
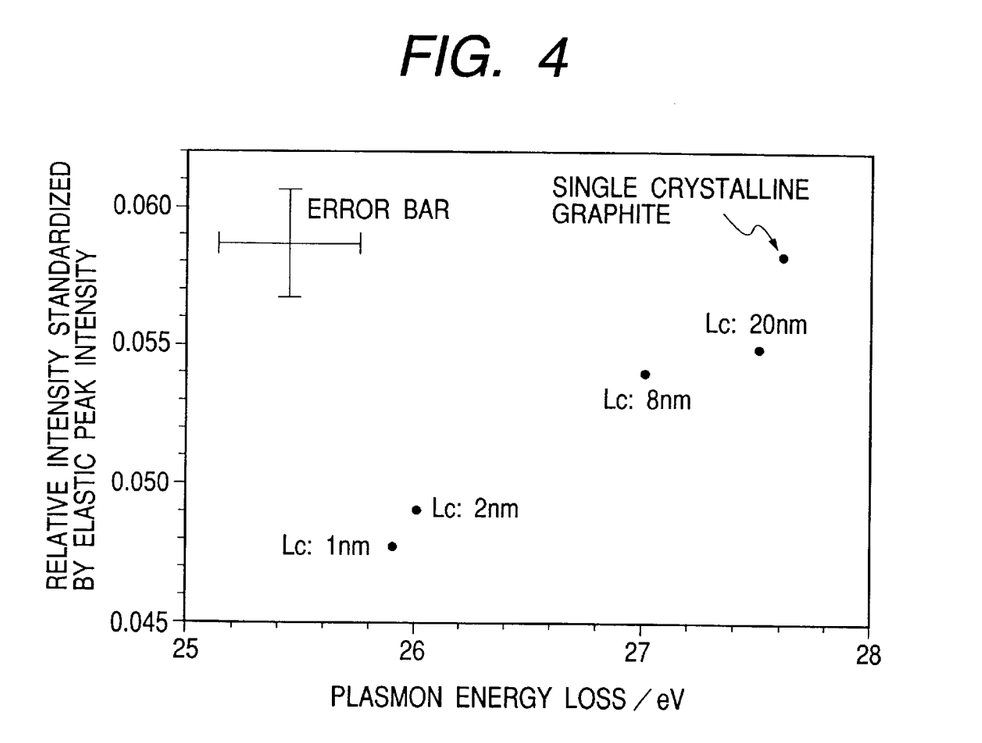
FIG. 4 is a graph showing the relationship between the graphite plasmon loss energy and the relative peak intensity (as standardized by the elastic peak intensity).

FIG. 3 is a graph showing the relationship between the graphite $\pi \rightarrow \pi^*$ loss energy and the relative peak intensity and FIG. 4 is a graph showing the relationship between the graphite plasmon loss energy and the relative peak intensity obtained for the specimens of the four types having different average crystallite sizes. It will be seen from the graphs that an excellent correlation is observable between the intensity of (1) and that of (2) and also among the crystallite sizes of graphite.

It will also be seen that, as the crystallite size of graphite change, the profile of the background of the continuous spectra formed by inelastic electrons also slightly changes.

For example, the relative intensity of the background with regard to the elastic peak at the point where the electron energy loss is 500 eV increases as a function of the crystallite size (not shown). This is because the probability of inelastic scattering increases as the crystallite size of graphite is reduced.

In other words, it seems that both the profile and the intensity of the background of the continuous spectrum formed by inelastic scattering reflect the crystallite size of graphite and hence may be used for analyzing the crystallite size of graphite.

As described above, (1) the relative intensity of the plasmon peak to the elastic peak or a profile of the background of the continuous spectra formed by inelastic electrons, (2) the peak attributed to $\pi \rightarrow \pi^*$ transition and the relative intensity of the $\pi \rightarrow \pi^*$ peak to the elastic peak or a profile of the background of the continuous spectra formed by inelastic electrons and (3) the profile of the background of the continuous spectrum or the relative intensity of a point with regard to the elastic peak observed in the electron energy loss spectrum excellently reflect the crystallite size of graphite so that the average crystallite size of graphite found in a surface layer with a thickness of not more than 10 nm and in an area where the thin film is incorporated is 1 μm and less square can be determined with ease by means of the above correlations.

Experiment 2:

In this experiment, graphite carbon was deposited on cobalt (Co) by means of thermal CVD and the average crystallite size of the graphite was observed by a method of using the energy loss spectrum of reflected electrons, Raman spectroscopy and X-ray deflection method. The obtained results will be discussed below.

Figure 5:
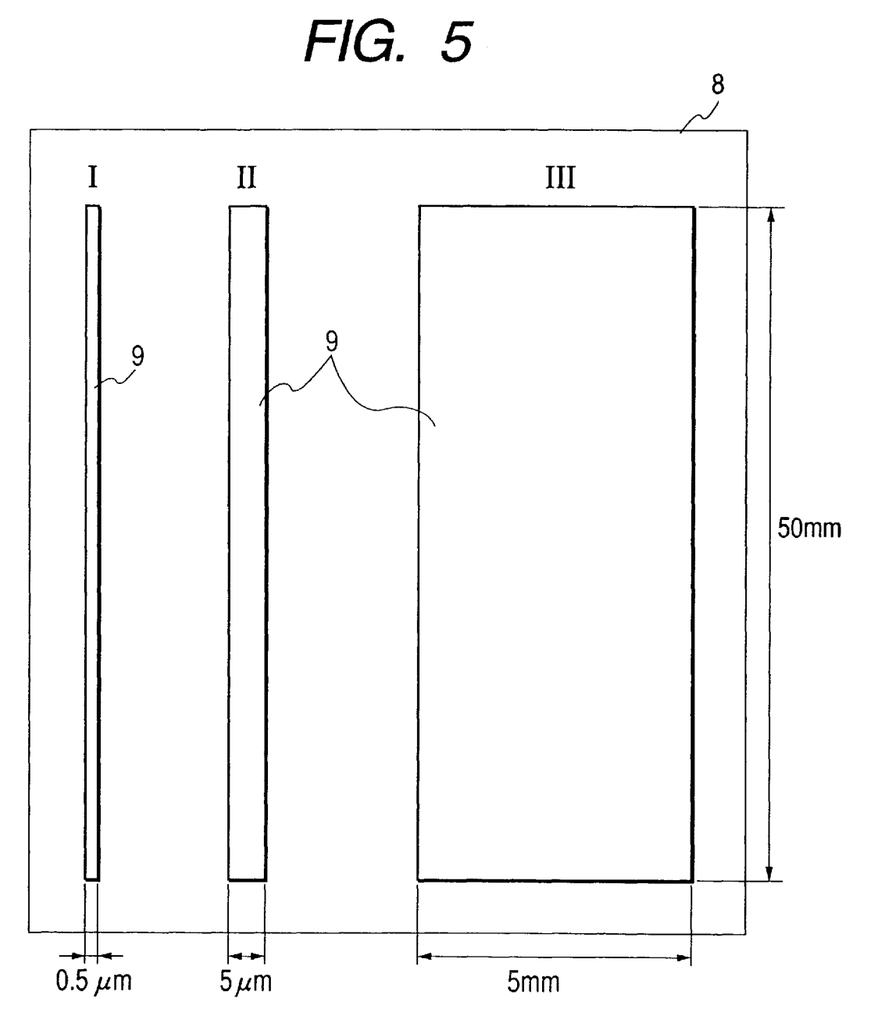
FIG. 5 is a schematic plan view of a substrate for forming and analyzing thermal CVD carbon.

Firstly, specimens were prepared in a manner as described below by referring to FIG. 5. FIG. 5 shows a substrate used for forming a carbon film by thermal CVD and for analyzing the obtained film. In FIG. 5, reference numeral 8 denotes a quartz glass substrate and reference numeral 9 denotes cobalt (Co) thin films.

A total of three different cobalt thin films, thin films I, II and III, were formed on the substrate with different widths. All the cobalt thin films had a thickness of about 100 nm.

Then, the substrate was heated to 800° C. and carbon was deposited on the Co thin films by thermal CVD, using acetone as carbon source. The pressure used for introducing acetone was 1 Torr and the carbon deposits (the film thickness of the carbon films as will be described hereinafter) were controlled by controlling the time during which acetone was introduced.

The carbon deposits formed on the respective cobalt thin films were observed through a scanning electron microscope to find that carbon had been deposited in the form of islands that were about several μm large. In other words, there were areas where carbon had been deposited and areas where practically no carbon had been deposited. Then, the islands of carbon were observed through an atomic force microscope (AFM) to determine the film thickness of the deposited carbon films in terms of the height of the islands.

In this experiment, carbon deposits of four different types having respective film thicknesses of 1 nm, 6 nm, 33 nm and 105 nm were produced by controlling the time during which acetones was fed. Then, the average crystallite size was determined for each of them by means of the above described technique. The specimens were cooled to room temperature and exposed to the atmosphere before starting the analysis.

The results are shown in Table 1 below.

In Table 1, x indicates a case where the film thickness could not be determined. The conditions of this experiment under which the energy loss spectrum of reflected electrons was used were same as those of Experiment 1.

TABLE 1

| Film thickness of deposited carbon as determined by AFM (nm) | Average crystallite size of graphite (nm) | | | | | | | | |
|---|---|---|---|---|---|---|---|---|---|
| | Method of the present invention | | | Raman spectroscopy | | | X-ray diffraction method | | |
| | I | II | III | I | II | III | I | II | III |
| 1 | 1–2 | 1–2 | 1–2 | x | x | x | x | x | x |
| 6 | 2 | 2 | 2 | x | (2) | (2) | x | x | x |
| 33 | 2 | 2 | 2 | x | 2 | 2 | x | x | (2) |
| 105 | 2–3 | 2–3 | 2–3 | x | 2–3 | 2–3 | x | x | 2–3 |

As seen from Table 1, a method according to the invention can advantageously be used for determining the average crystallite size of graphite found in a surface layer with a thickness of not more than 10 nm and in an area where the thin film is incorporated is 1 μm and less square, while neither Raman spectroscopy nor X-ray deflection method are feasible for such an application.

As described above, with a method of observing the average crystallite size of graphite, the average crystallite size of graphite found in a surface layer with a thickness of not more than 10 nm and in an area where the thin film is incorporated is 1 μm and less square can be determined with ease simply by means of an electron gun and an electron energy analyzer.

Now, an apparatus and a method of preparing a carbon thin film containing graphite as principal ingredient by using a system of analyzing such a thin film that has the above described configuration will be discussed below.

Experiment 3:

In this experiment, a carbon thin film was formed in a micro-area having a width not more than 1 μm by a combined use of thermal CVD and reflected electron energy loss spectroscopy, controlling the crystallite sizes of graphite.

Figure 6:
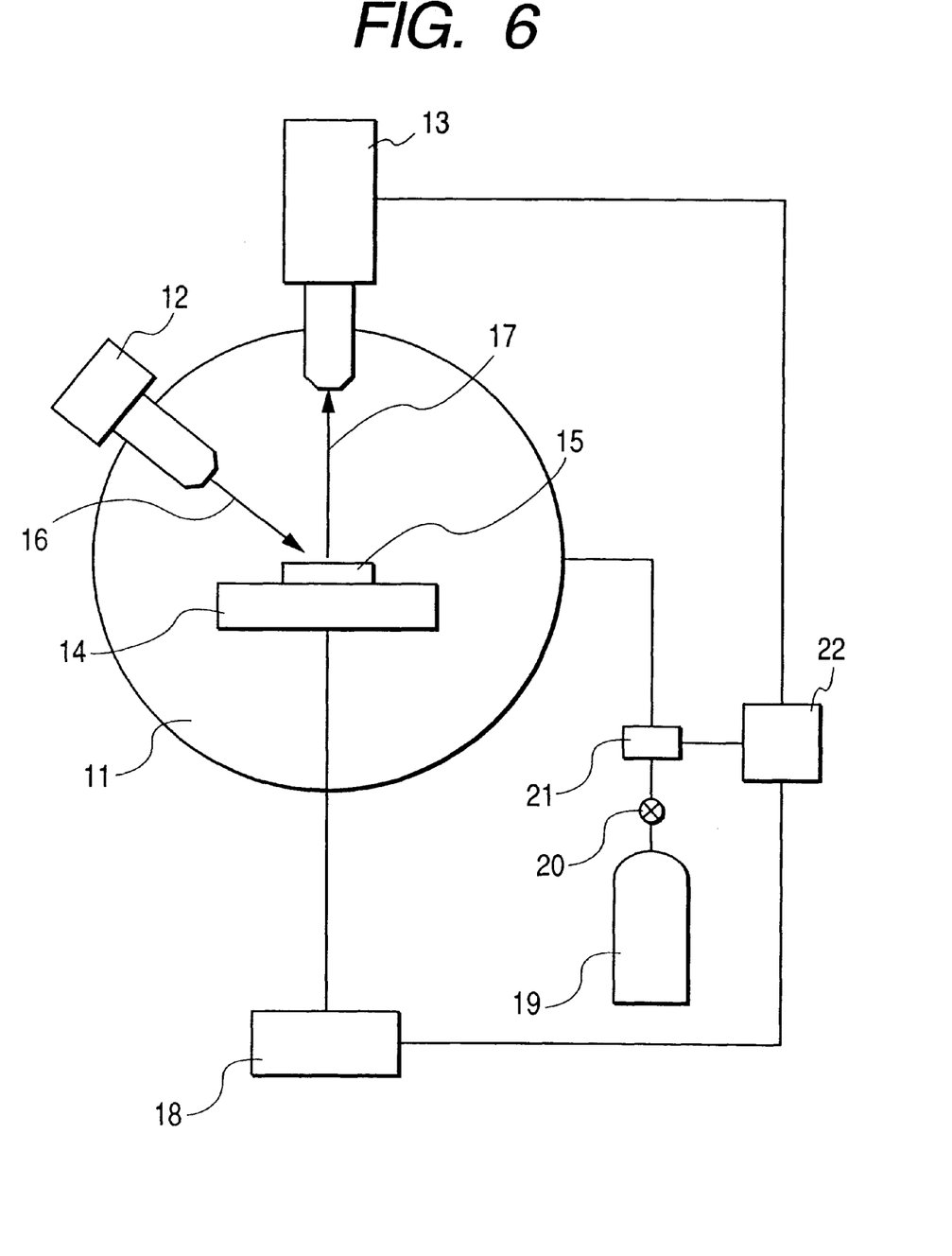
FIG. 6 is a schematic block diagram of an embodiment of apparatus for preparing carbon thin film according to the present invention.

FIG. 6 is a schematic block diagram of an embodiment of apparatus for preparing carbon thin film according to the invention.

Referring to FIG. 6, there are shown a vacuum container 11, an electron gun 12, an electron energy analyzer 13 including a detector, a specimen stage 14, a specimen 15, a primary electron beam 16, electrons 17 reflected at the surface of the specimen 15, a power source 18 for heating the specimen, a source gas container 19, a valve 20, a flow rate controller 21 and a control means 22. Note that a reflected electron energy loss spectroscopy system for analyzing the thin film is formed by the vacuum container 11, the electron gun 12, the analyzer 13 and the specimen stage 14 as in the case of FIG. 1. A concentric spherical energy analyzer was used in this experiment.

As in the case of Experiment 1, a substrate for forming a carbon thin film and analyzing the formed thin film as shown in FIG. 5 and an apparatus for forming a thin film as shown in FIG. 6 were used in this experiment. In this experiment, a graphite thin film with an average crystallite size of 2 nm was formed as thin film I (0.5 μm wide) shown in FIG. 5 in a manner as described below.

Firstly, as conditions of the thermal CVD, acetone was introduced as source gas under (fixed) pressure of 1 Torr and the substrate was heated to the initial temperature of 800° C.

The operation of reflected electron energy loss spectroscopy was conducted under the conditions same as those of Experiment 1 except that the specimen was not exposed to the atmosphere and held constantly in the same vacuum container 11. More specifically, after introducing acetone for a predetermined period of time, the inside of the container was evacuated to observe the reflected electron energy loss spectrum. During the observation of the spectrum, the temperature of the substrate was held constant. After the observation of the spectrum, the temperature of the substrate was changed when it was determined that such a change was necessary as a result of spectrum analysis. The above sequence was repeated each time after introducing acetone for 10 minutes.

The signal obtained by the above described reflected electron energy loss spectroscopy was then fed back to the power source 18 for heating the specimen by way of the control means 22. Thus, the relationship between the substrate temperature and the crystallite size of graphite that had been determined in advance and the relationship between the reflected electron energy loss spectrum and the crystallite size of graphite as described above were utilized in this experiment. In the course of producing graphite thin film, the temperature of the substrate was found to be at 780° C. when observed 30 minutes after the start of introducing acetone.

As a result, a graphite thin film was formed in a micro-area with a width of not more than 1 μm and it was found that the average crystallite size (2 nm) of graphite was neatly observed in a direction along the depth of the thin film.

Experiment 4:

In this experiment, a graphite thin film was formed in a micro-area with a width of not more than 1 μm and an average crystallite size of graphite of 10 nm by means of the apparatus and the method used in Experiment 3.

This experiment differed from Experiment 3 only in that the initial substrate temperature was 920° C. in this experiment. Thus, in this experiment again, a graphite thin film was formed in a micro-area and it was found that the average crystallite size of graphite was neatly observed in a direction along the depth of the thin film.

Experiment 5:

In this experiment, a graphite thin film was formed in a micro-area with a width of not more than 1 μm and an average crystallite size of graphite of 3 nm by means of the apparatus and the method used in Experiment 3.

This experiment differed from Experiment 3 only in that the cobalt (Co) thin film 22 as shown in FIG. 5 was replaced by a nickel (Ni) thin film and benzene was used instead of acetone as source gas, while the initial substrate temperature was 850° C. in this experiment. Thus, in this experiment again, a graphite thin film was formed in a micro-area and it was found that the average crystallite size of graphite was neatly observed in a direction along the depth of the thin film.

Figure 7:
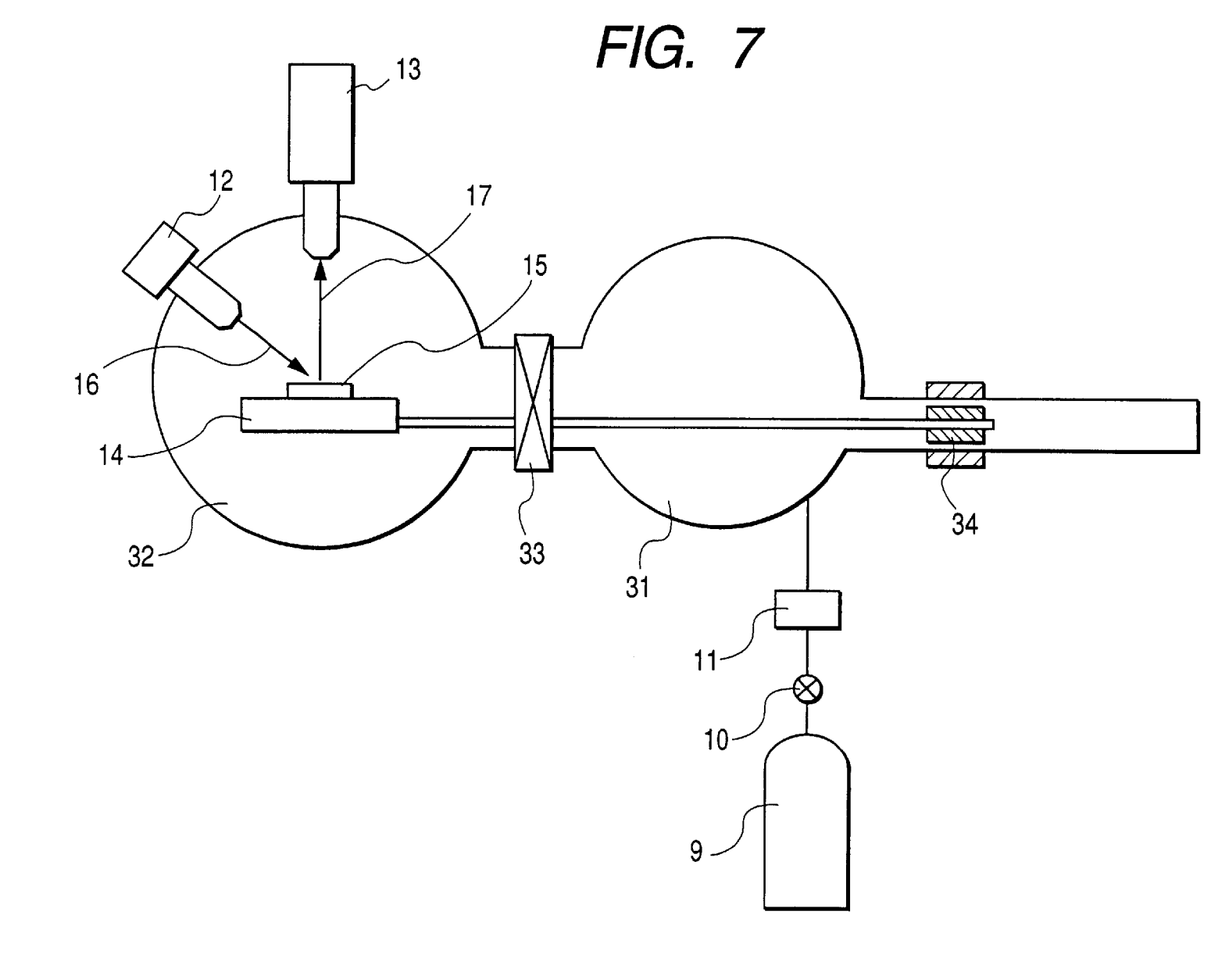
FIG. 7 is a schematic block diagram of another embodiment of apparatus for preparing carbon thin film according to the present invention.

Experiment 6:

In this experiment, the apparatus of preparing a carbon thin film shown in FIG. 6 and used in Experiment 3 was replaced by an apparatus as shown in FIG. 7. Except this, a carbon thin film was prepared in this experiment, using the conditions of thermal CVD and those of reflected electron energy loss spectroscopy of Experiment 3. Note that, in FIG. 7, the components same as their counterparts of FIG. 6 are denoted respectively by the same reference symbols.

In FIG. 7, the reflected electron energy loss spectroscopy system comprises an additional container 32 for observing the thin film that is separated from the container 31 for preparing a carbon thin film by means of a gate valve 33. A process of preparing a carbon thin film was conducted in the container 31 for forming a carbon thin film for 10 minutes and then the specimen 15 was moved into the container 32 for observing the thin film with the specimen stage 14 by means of a specimen conveyor 34 and observed for the reflected electron energy loss spectrum. Thereafter, the specimen 15 and the specimen stage 14 were moved back to the container 31 for preparing a carbon thin film and the result obtained by reflected electron energy loss spectroscopy was used to regulated the substrate temperature by way of a control means (not shown) to carry on the operation of preparing a carbon thin film.

Thus, in this experiment again, a graphite thin film was formed in a micro-area and it was found that the average crystallite size of graphite was neatly observed in a direction along the depth of the thin film.

As described above in detail, with an apparatus and a method for forming, carbon thin film according to the invention, a graphite thin film can be effectively formed in a micro-area of 1 $\mu$m and less square, controlling the crystallite size of graphite.

What is claimed is:

1. A method of determining an average crystallite size of a material having a crystal structure and exhibiting an absorption in ultraviolet region, which comprises irradiating a specimen of the material with an electron beam, observing an energy loss spectrum of reflected electrons, and determining the average crystallite size of the material from observation of the loss spectrum.

2. A method of determining an average crystallite size according to claim 1, wherein an energy level of said electron beam is within a range between 200 eV and 3 keV.

3. A method of determining an average crystallite size according to claim 1, wherein the material comprises carbon as its principal ingredient.

4. A method of determining an average crystallite size according to claim 3, wherein said carbon as principal ingredient is graphite.

5. A method of determining an average crystallite size according to claim 3 or 4, wherein the crystallite size of the material is within a range between 2 nm and several tens of nm.

6. A method of determining an average crystallite size according to claim 3 or 4, wherein the specimen is in the shape of a thin film and the average crystallite size in an area of 1 $\mu$m and less square at a depth of not more than 10 nm from the surface of the thin film is measured.

7. A method of determining an average crystallite size according to claim 3 or 4, wherein a relation between said average crystallite size of the material of the specimen and at least one of the following three characteristics observed in the reflected electron energy loss spectrum, (1) an energy value of a plasmon peak, (2) a relative intensity of the plasmon peak to an electric peak and (3) a profile of the background of the continuous spectra formed by inelastic electrons, is used to determine the crystallite size.

8. A method of determining an average crystallite size according to any of claims 1, 3 and 4, wherein a relation between said average crystallite size of the material of the specimen and at least one of the following three characteristics observed in the reflected electron energy loss spectrum, (1) an energy value of a peak attributed to $\pi \rightarrow \pi^*$ transitions, (2) a relative intensity of the $\pi \rightarrow \pi^*$ peak to an electric peak and (3) a profile of the background of the continuous spectra formed by inelastic electrons, is used to determine the crystallite size.

9. A method of determining an average crystallite size according to claim 3 or 4, wherein a correlation of a profile of a background of a continuous spectrum formed by inelastic electrons observed in the reflected electron energy loss spectrum and/or a relative intensity of a point of an electric peak, and said average crystallite size of the material of the spectrum are used to determine the crystallite size.

10. A method of determining an average crystallite size of a material having a crystal structure and exhibiting an absorption in ultraviolet region, which comprises irradiating a specimen of the material with an electron beam and observing an energy loss spectrum of reflected electrons,
wherein the crystallite size of the material is within a range between 2 nm and several tens of nm.

11. A method of determining an average crystallite size of a material having a crystal structure and exhibiting an absorption in ultraviolet region, which comprises irradiating a specimen of the material with an electron beam and observing an energy loss spectrum of reflected electrons,
wherein the specimen is in the shape of a thin film and the average crystallite size in an area of 1 $\mu$m and less square at a depth of not more than 10 nm from the surface of the thin film is measured.

12. A method of determining an average crystallite size of a material having a crystal structure and exhibiting an absorption in ultraviolet region, which comprises irradiating a specimen of the material with an electron beam and observing an energy loss spectrum of reflected electrons,
wherein a relation between said average crystallite size of the material of the specimen and at least one of the following three characteristics observed in the reflected electron energy loss spectrum, (1) an energy value of a plasmon peak, (2) a relative intensity of the plasmon peak to an electric peak and (3) a profile of the background of the continuous spectra formed by inelastic electrons, is used to determine the crystallite size.

13. A method of determining an average crystallite size of a material having a crystal structure and exhibiting an absorption in ultraviolet region, which comprises irradiating a specimen of the material with an electron beam and observing an energy loss spectrum of reflected electrons,
wherein a correlation of a profile of a background of a continuous spectrum formed by inelastic electrons observed in the reflected electron energy loss spectrum and/or a relative intensity of a point of an electric peak, and said average crystallite size of the material of the spectrum are used to determine the crystallite size.

* * * * *

UNITED STATES PATENT AND TRADEMARK OFFICE
CERTIFICATE OF CORRECTION

PATENT NO.   : 6,420,701 B1                                       Page 1 of 1
DATED        : July 16, 2002
INVENTOR(S)  : Hiroyuki Hashimoto It is certified that error appears in the above-identified patent and that said Letters Patent is hereby corrected as shown below:

<u>Title page,</u>
Item [56], FOREIGN PATENT DOCUMENTS, "4/1994" should read
-- 12/1994 --; and
OTHER PUBLICATIONS, ""Characteristics" should read -- "Characteristic --.

<u>Column 3,</u>
Line 51, "Sp$^2$" should read -- sp$^2$ --;
Line 53, "Sp$^2$" should read -- sp$^2$ --; and
Line 57, "n-bands," should read -- π-bands, --.

<u>Column 7,</u>
Line 40, close up right margin;
Line 41, close up left margin; and
Line 43, "the" (first occurrence) should be deleted.

<u>Column 10,</u>
Line 51, close up right margin; and
Line 52, close up left margin.

<u>Column 11,</u>
Line 7, "acetones was" should read -- acetones were --.

Signed and Sealed this

Fourth Day of March, 2003

JAMES E. ROGAN
*Director of the United States Patent and Trademark Office*